United States Patent
Hamaguchi et al.

(10) Patent No.: US 6,621,734 B2
(45) Date of Patent: Sep. 16, 2003

(54) NONVOLATILE SEMICONDUCTOR MEMORY DEVICE AND ELECTRONIC INFORMATION APPARATUS

(75) Inventors: Koji Hamaguchi, Tenri (JP); Ichiro Tomohiro, Shijonawate (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/154,531

(22) Filed: May 22, 2002

(65) Prior Publication Data

US 2002/0181280 A1 Dec. 5, 2002

(30) Foreign Application Priority Data

May 30, 2001 (JP) ........................................ 2001-163487

(51) Int. Cl.[7] .............................................. G11C 16/06
(52) U.S. Cl. ............................ 365/185.09; 365/185.01; 365/200; 365/185.2
(58) Field of Search ..................... 365/185.09, 185.01, 365/200, 185.2, 210, 201, 49, 189.01

(56) References Cited

U.S. PATENT DOCUMENTS 6,525,963 B2 * 2/2003 Kern et al. ............ 365/185.09

FOREIGN PATENT DOCUMENTS

| JP | 08-007595 | 1/1996 |
|---|---|---|
| JP | 2000-067594 | 3/2000 |

* cited by examiner

*Primary Examiner*—David Lam
(74) *Attorney, Agent, or Firm*—Morrison & Foerster LLP

(57) ABSTRACT

A nonvolatile semiconductor memory device of the present invention includes: a main memory circuit including memory cells arranged in a matrix form, the memory cells being formed of electrically writable and erasable floating gate transistors each provided at an intersection of a bit line and a word line; and a redundant substitution information memory circuit including a plurality of memory cells formed of the electrically writable and erasable floating gate transistors, wherein one end of each memory cell formed of the floating gate transistors in the redundant substitution information memory circuit can be electrically connected to and disconnected from the bit line in the main memory circuit by a selection transistor so as to supply the memory cells in the redundant substitution information memory circuit with current for writing and reading operations via the bit lines.

11 Claims, 11 Drawing Sheets

NONVOLATILE SEMICONDUCTOR MEMORY DEVICE AND ELECTRONIC INFORMATION APPARATUS

BACKGROUND OF THE INVENTION

1. Field of the Invention

The present invention relates to a nonvolatile semiconductor memory device which allows redundant substitution information (e.g., address information), information used for device adjustments and the like to be written separately in a nonvolatile memory cell. The present invention also relates to an electronic information apparatus using such a nonvolatile semiconductor memory device.

2. Description of the Related Art

A conventional nonvolatile semiconductor memory device has a redundant function of substituting a malfunctioned word line, a malfunctioned bit line and a malfunctioned memory cell with a spare redundant word line, a spare redundant bit line and a spare redundant memory cell, respectively, so as to improve a defect rate.

In general, when the malfunctioned word line, bit line or memory cell is detected in a semiconductor memory device by a tester during a production shipment test, the tester causes a redundant address memory circuit provided in the same semiconductor memory device to store address information of the malfunctioned word line, line or memory cell. This address information stored in the redundant address memory circuit is ref erred to as the "malfunctioned address", "redundant address" or "defective address".

In a DRAM, an SRAM or the like, a redundant address memory circuit including fuses made of polysilicon is generally used while the nonvolatile semiconductor memory device, which uses floating gate transistors as memory cells of a main memory circuit, uses similar floating gate transistors to those of the main memory circuit as the memory cells of the redundant address memory circuit (hereinafter, referred to as the "redundant memory circuit").

An operation principle of the conventional redundant memory circuit used in a nonvolatile semiconductor memory device is now described with respect to a case where a word line of the nonvolatile semiconductor memory device is defective. When the defective word line is substituted with the redundant word line, an address of the defective word line is stored in the redundant memory recruit The redundant memory circuit is a memory circuit addressable according to contents (which is referred to as a "CAM (Content-Addressable Memory)"). When address information is input to the main memory circuit, this address information is always input to the redundant memory circuit (CAM) as well. When an address contained in the input information is identical to an address stored in the redundant memory circuit, the redundant memory circuit is validated so as to break the connection to the defective word line and switch over to the connection to the redundant word line.

In the main memory circuit having a capacity of about several mega bits, several defects can occur, and therefore the number of restorable defective word lines corresponds to the number of the redundant word lines provided in the main memory circuit. Each redundant word line is combined with a redundant memory circuit which stores address information for a corresponding defective word line. In order to correct for N defects, N redundant word lines and N redundant memory circuits are required. Further, the redundant memory circuit requires a single validation bit, which indicates that a redundant circuit corresponding to the redundant memory circuit can be actually operated when address information for the defective word line is input to the redundant memory circuit. Where word line address information for the main memory circuit has a size of M bits, the redundant memory circuit is required to include memory cells for at least M+1 bits of information. Accordingly, in order to satisfy these requirements, the total number of bits required by the redundant memory circuit is N×(M+1).

FIG. 5 shows one possible way of configuring memory and readout cells for a defective address bit (or a validation bit), that is, one of the M+1 cell circuits of the redundant memory circuit, and its associated redundant information readout circuit, is shown.

In FIG. 5, drains of floating gate transistors TGF1 and TGF2 are respectively connected to both ends (points C or D) of a latch circuit via respective NMOS transistors T3 and T4, which are turned on during a reading operation. Sources of floating gate transistors TGF1 and TGF2 can be connected to ground (not shown). A source voltage VS applied to the floating gate transistors TGF1 and TGF2 is 0 V during reading or writing operations and is about 6 V during an erasing operation.

The NMOS transistors T3 and T4 also have a bias effect for reducing a drain voltage applied to the floating gate transistors TGF1 and TGF2 so as to prevent drain disturb caused to the floating gate transistors TGF1 and TGF2. These two floating gate transistors TGF1 and TGF2 have a common word line VGF.

Sources of NMOS transistors T9 and T10 of this latch circuit are connected to a drain of an NMOS transistor T8 which is turned off when the transistors TGF1 and TGF2 are in a reading operation. That is, during the reading operation, the latch circuit does not perform data-hold, and after the reading operation, i.e., after data has been validated, the latch circuit holds data. One end (point D) of the latch circuit is connected to a drain of an NMOS transistor T7 for initializing data in the latch circuit. A source of the NMOS transistor T7 is connected to ground.

NMOS transistors T5 and TI5 are connected in series between the drain of the floating gate transistor TGF1 and a VPRG input port to which a write voltage VPRG is applied when writing data to the floating gate transistor TGF1. The NMOS transistors T5 and TI5 are always in an OFF state unless a writing operation is performed. Similarly, NMOS transistors T6 and TI6 are connected in series between the drain of the floating gate transistor TGF2 and the VPRG input port.

When either one of the floating gate transistors TGF1 and TGF2 is programmed, an output Out of this cell circuit takes a logic level "0" or "1" according to a state of either one of the floating gate transistors TGF1 and TGF2. An operation principle of reading data from the redundant memory circuit CAM is now described with respect to a case where the floating gate transistors TGF1 and TGF2 are respectively in an erasing state and a writing state.

Unlike a writing operation, in the operation of reading redundant information, all the transistors T5, TI5, T6 and TI6 are in an "OFF" state. Further, a read signal VB is at a low level and the transistors T3 and T4 are in an "OFF" state. In this case, the floating gate transistor TGF1 is isolated from the PMOS transistor T1 and the NMOS transistor T9 of the latch circuit by the transistor T3, and the floating gate transistor TGF2 is isolated from the PMOS transistor T2 and the NMOS transistor T10 of the latch circuit by the transistor T4.

Further, an inverted signal NVB to the readout signal VB is at a high level and the NMOS transistor T8 is in an "ON" state. Accordingly, the latch circuit is formed by the transistors T1, T2, T8, T9 and T10 so as to hold data.

Thereafter, when an initialization signal INT is at a high level, the transistor T7 is turned on so that a potential at point D (the drain side) of the transistor T7 is at a low level (a ground level). The output Out provided via inverters INV1 and INV2 by the redundant memory circuit CAM has a low level equal to the level of the potential at point D.

On the other hand, at another output side (i.e., point C) of the latch circuit formed by the transistors T1, T2, T8, T9 and T10, a voltage applied at point C is at a high level equal to the level of a power supply voltage Vcc since the transistor T1 is turned on by the low-level potential at point D. Thereafter, when the initialization signal INT is at a low level, the transistor T7 is turned off. Further, the readout signal VB is at a high level, and therefore the inverted signal NVB with respect to the read signal VB is at a low level. At this time, the sources of the transistors T9 and T10 are isolated from ground, so that the data-hold is broken. Simultaneously, the transistors T3 and T4 are turned on, and therefore two arms of a ratio arm circuit are formed between the power supply Vcc and a common input port of the floating gate transistors TGF1 and TGF2 to which the source voltage VS is applied (ground potential during a reading operation). One of the two arms includes transistors T1 and T3, and the floating gate transistors TGF1, which are connected in series. The other of the two arms includes transistors T2 and T4, and the floating gate transistor TGF2, which are connected in series.

In an initialization operation, when the potential at point D is at a low level, the transistor T1 is turned on, and the potential at the drain (point C) of the transistor T3, i.e., a gate voltage of the transistor T2, is at a high level, and thus the transistor T2 is turned off. In this case, the drain (point D) of the transistor T4, i.e., agate voltage of the transistor T2, is at a low level, and therefore the transistor T1 maintains an "ON" state.

In the case where the floating gate transistor TGF1 is in an erasing operation, i.e., the floating gate transistor TGF1 is turned on, when the current driving power of the floating gate transistor TGF1 is sufficiently higher than that of the PMOS transistor T1, the potential at point C is at a low level. Simultaneously, a gate voltage of the PMOS transistor T2 is at a low level, and therefore the transistor T2 is turned on and point D is charged by the power source voltage Vcc so that the potential at point D reaches a high level.

The floating gate transistor TGF2 is in a writing operation, i.e., in an "OFF" state, the potential at point D maintains a high level, and therefore the transistor T1 is turned off.

Thereafter, the read signal VB and the inversion signal NVB with respect to the read signal VB are respectively at low and high levels, so that a latch circuit is formed by the transistors T1, T2, T8, T9 and T10 so as to hold data, and the output Out provided via inverters INV1 and INV2 by the cell circuit is at a high level. In this manner, a value for an address bit (or a validation bit) is determined by the output Out from the cell circuit.

When holding data in the floating gate transistors TGF using the latch circuit, a single-end circuit as shown in FIG. 6, different to the differential-type circuit shown in FIG. 5, is generally used for configuring the redundant memory circuit CAM which uses the floating gate transistors TGF and the redundant information readout circuit associated with the redundant memory circuit CAM.

The single-end circuit of FIG. 6 is different from the differential-type circuit of FIG. 5 in that the single-end circuit of FIG. 6 does not include the serially-connected floating gate transistor TGF2 and NMOS transistor T4 which is turned on when the floating gate transistor TGF2 is in a reading operation. Further, the single-end circuit of FIG. 6 does not include the transistor T8 which controls data-hold in the latch circuit, like the differential-type circuit of FIG. 5 does. Such a single-end circuit is disclosed in Japanese Patent Application No. 10-238711. Alternatively, a bistable multivibrator (Japanese Laid-Open Patent Publication No. 8-7595) as shown in FIG. 7, which also does not hold data in the latch circuit, can be used as the redundant information readout circuit.

In the case where the cell circuit corresponds to one of M defective address bits, outputs from M cell circuits, i.e., an output from the redundant information readout circuit, are input to one input port of an exclusive-OR gate. Corresponding address bits received by the main memory circuit are input to the other input port of the exclusive-OR gate. Outputs from the exclusive-OR gate each corresponding to a different address bit in the single redundant memory circuit are input to an input port of a NOR gate. The NOR gate outputs a logic level "1" only when all the input address bits match the corresponding address bits in the redundant memory circuit. The output from the NOR gate is validated by an output corresponding to a validation bit from a memory cell, e.g., from an AND gate. The output from the AND gate is the output from the redundant information readout circuit and is used to open a redundant path when an address input to the main memory circuit corresponds to a defective address stored in the redundant memory circuit.

In general, the defective address is written in the redundant memory circuit only during a test operation. When any defect is detected, a defective address is written in the redundant memory circuit. Each time any defect is detected, a defective address is written in a corresponding redundant memory circuit.

In this normal operation of the nonvolatile semiconductor memory device as described above, an address input to the nonvolatile semiconductor memory device is simultaneously input in the main memory circuit and the redundant memory circuit. As described above, when the input address corresponds to an address stored in the redundant memory circuit, a redundant path corresponding to the address is open. Accordingly, in order to input the defective address in the redundant memory circuit, each address bit of the nonvolatile semiconductor memory device is input to a corresponding cell of the redundant memory circuit. When a defect is detected at an address where the testing operation is being performed, a prescribed programming is executed according to instructions by a testing device.

FIG. 8 is a circuit diagram showing a primary structure of a conventional nonvolatile semiconductor memory device including a main memory circuit and a redundant memory circuit. For simplification of description, FIG. 8 only illustrates the floating gate transistors TGF, the transistors T5 and TI5, the gate voltage VGF and source voltages VS applied to the floating gate transistors TGF, the voltage VPRG, which is applied to a drain of the floating gate transistor TGF during a writing operation, and the redundant information readout circuit (a CAM readout circuit), which are shown in FIGS. 5 through 7, a memory cell array of the main memory circuit, and a row decoder for selecting a word line corresponding to a memory cell address.

In practice, the redundant memory circuit CAM and its associated redundant information readout circuit (a CAM readout circuit) include cell circuits corresponding to N×(M+1) bits. Each of transistors T51, T52 and T53 has a similar function to that of the transistor denoted by T5 in FIGS. 5–7. Transistors TI51, TI52 and TI53 are respectively used to isolate the transistors T51, T52 and T53 from their corresponding floating gate transistor TGF in the redundant memory circuit CAM.

In FIG. 8, MVPRG0, MVPRG1 and MVPRG2 denote bit lines for memory cells M in the main memory circuit. MVS1, MVS2 and MVS3 denote source potential of the memory cells M in the main memory circuit. In this circuit structure, the row decoder for the main memory circuit is used to select a word line W so as to write redundant information (a defective address) in the memory cell (the floating gate transistor TGF) in the redundant memory circuit CAM.

Conventionally, in order to efficiently realize such a circuit structure, unnecessary spaces in the circuit are reduced by employing a circuit layout shown in FIG. 9.

FIG. 9 shows a circuit layout of a semiconductor chip including: the row decoder for selecting a word line W; a column decoder circuit for selecting a bit line B in a memory cell array, which corresponds to an address in the main memory circuit; the main cell array in the main memory circuit; and a sense amplifier for reading data from the main memory circuit. It should be noted that in FIG. 9, lines denoted by B and W do not represent actual word lines W and bit lines B themselves but only represent directions along which the word lines W and bit lines B are provided. A swapped signal shown in FIG. 9 is used to open a redundant path when a defective address to be substituted is input to the main memory circuit. The swap signal is output by the redundant memory circuit CAM so as to be input to the row decoder and column decoder.

By employing the circuit layout shown in FIG. 9, unnecessary spaces are not provided and a line from the redundant memory circuit CAM to each decoder can be short.

Next, a nonvolatile semiconductor device having a fast readout function, such as synchronous burst readout and page-mode readout, is considered. FIG. 10 shows an example of circuit layouts of the nonvolatile semiconductor device having a fast read function with the circuit structure shown in FIG. 8 being maintained.

The nonvolatile semiconductor memory device having a fast readout function requires a plurality of sense amplifiers. As shown in FIG. 10, in general, by changing the circuit structure shown in FIG. 9 such that respective directions of the bit lines B and word lines W for the main memory array are interchanged with each other, the sense amplifiers are positioned in a direction along which the bit lines B are provided so as to reduce an output load provided to the bit lines and sense amplifiers as much as possible. Along with this change, the row decoders and column decoders are rearranged from the arrangement shown in FIG. 9 to the arrangement shown in FIG. 10.

In FIG. 10, since the redundant memory circuit CAM is opposed to the row decoder with respect to the memory cells M, a signal output by the redundant memory circuit CAM is input to the row decoder detouring around the memory cells M, causing an extremely heavy line load. This adversely affects a speed of a signal transferred from the redundant memory circuit CAM to the row decoder. Therefore, when an address of a defective word line substituted with a redundant word line is input to the main memory circuit, there is a delay in reading the address as compared to the case of reading an address of a normal word line. Further, as shown in FIG. 10, a circuit layout area is increased because of unnecessary space existing in a region below the redundant memory circuit CAM in FIG. 10.

In the redundant memory circuit CAM, the redundant memory circuit cells corresponding to N×(M+1) bits are arranged as shown in FIGS. 5–7. FIG. 11 shows part of the redundant memory circuit including the redundant memory circuit cells shown in FIG. 5. In FIG. 11, for simplification of description, the redundant memory circuits CAM corresponding to a three-bit output are shown.

The cell circuits are commonly provided with the signal VB which is at a high level when data is read from the floating gate transistor TGF, the inverted signal NVB to the floating gate transistor TGF, the word line voltage VGF, the bit line voltage VPRG which is a high voltage applied to the drain of the floating gate transistor TGF so as to write data in the memory cell (the floating gate transistor TGF) in the redundant memory circuit CAM, and the source voltage VS of the floating gate transistor TGF. On the other hand, selection signals PROG and NPROG used for selecting the floating gate transistor TGF to which data is written are provided to each redundant memory circuit cell.

Since the conventional redundant memory circuit CAM uses all the memory cells thereof, when there is a defect in a single memory cell in the redundant memory circuit CAM, an entire chip including the redundant memory circuit CAM results in a defective chip which cannot be relieved by the redundant memory circuit CAM. Further, when there is a defect in a bit line to which the bit line voltage VPRG for writing is applied, it is not possible to write data in all the memory cells in the redundant memory circuit CAM, whereby the entire chip including the redundant memory circuit CAM also results in a defective chip which cannot be relieved by the redundant memory circuit CAM.

Furthermore, since the memory cells in the redundant memory circuit CAM are designed according to the same design rule as the memory array in the main memory circuit, as the semiconductor memory device becomes more compact, a space between adjacent cells in the redundant memory circuit becomes narrower. This increases the possibility that circuit failure occurs due to a short-circuit between the adjacent cells.

Further still, in the conventional redundant memory circuit cells, there is a possibility that redundant information (a defective address) cannot be read from the floating gate transistor TGF in a normal manner when the power supply voltage is low (e.g., about 1.8 V). The principle of the aforementioned readout operation is described with reference to an example of the redundant memory circuit cell shown in FIG. 5.

An output of the redundant memory circuit cell is determined according to a programmed transistor of two transistors in the redundant memory circuit cell. Data representing a state (an output) of the cell is read from a drain of one of PMOS transistors (e.g., T2).

In this case, the floating gate transistor TGF1 is in a writing state, and the floating gate transistor TGF2 is in an erasing state. A voltage applied at point D (drain side) of the transistor T2 is at a low level since the floating gate transistor TGF2 is in an erasing state, i.e., in an "ON" state. The voltage is input to a gate of the transistor T1 so that the transistor T1 is turned on. Further, a voltage applied at point C (drain side) of the transistor T1 is at a high level since the floating gate transistor TGF1 is in a writing state, i.e., in an "OFF" state. The voltage is input to the transistor T2 so that the transistor T2 is turned off and the voltage applied at point D of the transistor T2 maintains a low level.

However, when this conventional redundant memory circuit is used with a low power supply voltage, the driving power of the floating gate transistor TGF2 is lowered, and therefore the voltage applied at point D (drain side) of the transistor T2 is decreased to a midpoint potential but not to a low level.

In order to avoid this, it is necessary to reduce the power of the PMOS transistors T1 and T2 or an upper limit of the threshold voltage of the floating gate transistor TGF in an erasing state.

In the case where the power of the PMOS transistors T1 and T2 is reduced, provided that gate widths of the PMOS transistors T1 and T2 have been designed so as to be minimum under a design rule, gate lengths of the PMOS transistors T1 and T2 are required to be increased, resulting in an increase in a circuit layout area. On the other hand, in the case where the upper limit of threshold voltage of the floating gate transistor TGF in an erasing state is reduced, the time required for a testing operation becomes longer.

As described above, in the circuit arrangement of FIG. 10, where the sense amplifiers are disposed in the direction along which the bit lines B are provided, the nonvolatile semiconductor circuit can have a fast readout function while the redundant memory circuit CAM is opposed to the row decoder with respect to the memory cells M, and therefore a signal output from the redundant memory circuit CAM is input to the row decoder detouring around the memory cells M, causing an extremely heavy line load, so that a speed of a signal transferred from the redundant memory circuit CAM to the row decoder is adversary affected. Therefore, when an address of a defective word line substituted with a redundant word line is input to the main memory circuit, there is a delay in reading the address as compared to the case of reading an address of a normal word line. Further, as shown in FIG. 10, a circuit layout area is increased because of unnecessary space existing in a region below the redundant memory circuit CAM in FIG. 10.

SUMMARY OF THE INVENTION

According to one aspect of the present invention, there is provided a nonvolatile semiconductor memory device including: a main memory circuit including memory cells arranged in a matrix form, the memory cells being formed of electrically writable and erasable floating gate transistors each provided at an intersection of a bit line and a word line: and a redundant substitution information memory circuit including a plurality of memory cells formed of the electrically writable and erasable floating gate transistors, in which one end of each memory cell formed of the floating gate transistors in the redundant substitution information memory circuit can be electrically connected to and disconnected from the bit line in the main memory circuit by a selection transistor so as to supply the memory cells in the redundant substitution information memory circuit with current for writing and reading operations via the bit lines.

In one embodiment of this invention, at least two pairs of the redundant memory circuits and redundant information readout circuits are used for storing identical redundant memory information, and a logic circuit for performing a logical operation on outputs from the two redundant information readout circuits is connected to an output of each of the two redundant information readout circuits so as to reflect a normal output from either of the two redundant memory circuits in an output provided as one-bit binary information from the logic circuit.

In one embodiment of this invention, a single selection transistor is connected to drains of the plurality of memory cells included in the redundant substitution information memory circuit so as to form a parallel circuit.

In one embodiment of this invention, the redundant substitution information memory circuit is capable of storing information used for adjusting the memory device in addition to redundant substitution information.

In one embodiment of this invention, the number of the memory cells used in the redundant substitution information memory circuit is smaller than the number of the bit lines in the main memory circuit, and at least either of unused redundant substitution information memory cells or dummy bit lines are provided at a regular interval.

According to another aspect of the present invention, there is provided an electronic information apparatus including the nonvolatile semiconductor memory device of claim 1 for processing information.

Hereinafter, effects of the above-described structures are described. By changing the arrangement of the floating transistors in the redundant substitution information memory circuit so as to be in a direction along which the bit lines are provided, rather than a direction along which the word lines are provided as in the conventional nonvolatile semiconductor memory device, it is possible to prevent an increase in load provided to the lines in the redundant memory circuit as shown in FIG. 10 so as to provide a fast reading speed and it is also possible to eliminate unnecessary spaces in the circuit layout as shown in FIG. 10. Further, as compared to the conventional nonvolatile memory device in which the redundant memory circuit is positioned in a direction along which the word lines are provided, it is possible to eliminate the bit lines exclusively used for the redundant memory circuit as well as the redundant memory circuit selection transistors and their associated lines, thereby reducing a circuit layout area, i.e., an area of the chip can be reduced.

Further, the respective memory cells of the redundant substitution information memory circuits of two pairs (or more) store identical one-bit binary information, and therefore even in the case where there is a defect in one pair of floating gate transistors among the floating gate transistors in the redundant substitution information memory circuits of two pairs, when the other pair of the floating gate transistors are normal, the output having a normal value can be provided from the redundant substitution information memory circuit, thereby further improving circuit redundancy.

Furthermore, by providing at least either of the unused redundant substitution information memory cells or the bit lines at a regular interval in the sequentially-provided redundant memory circuits and redundant information readout circuits, a short-circuit is prevented from occurring between the adjacent cell circuits, thereby improving fault tolerance. This increases the possibility that the defective bit line B is relieved.

Further still, in one of the two arms formed between the redundant memory circuit and the redundant information readout circuit, a drain voltage of a PMOS transistor is determined by current power of the PMOS transistor and the two floating gate transistors. Therefore, in the case where the current driving power of the floating gate transistors is lower than that of the PMOS transistor, it is particularly effective that the drain voltage of the PMOS transistor is low.

Further still, the parallel circuit formed by the plurality of floating gate transistors realizes the redundant memory circuit which can perform reliable reading operation even at a low voltage.

Thus, the invention described herein makes possible the advantages of providing a nonvolatile semiconductor memory device in which high readout speed is realized by reducing load provided to lines in a redundant memory circuit and a circuit layout area, i.e., an area of a chip, is reduced by eliminating unnecessary spaces in the circuit layout.

These and other advantages of the present invention will become apparent to those skilled in the art upon reading and understanding the following detailed description with reference to the accompanying figures.

DESCRIPTION OF THE PREFERRED EMBODIMENTS

Hereinafter, embodiments of the present invention will be described with reference to the drawings.

Embodiment 1

Figure 1:
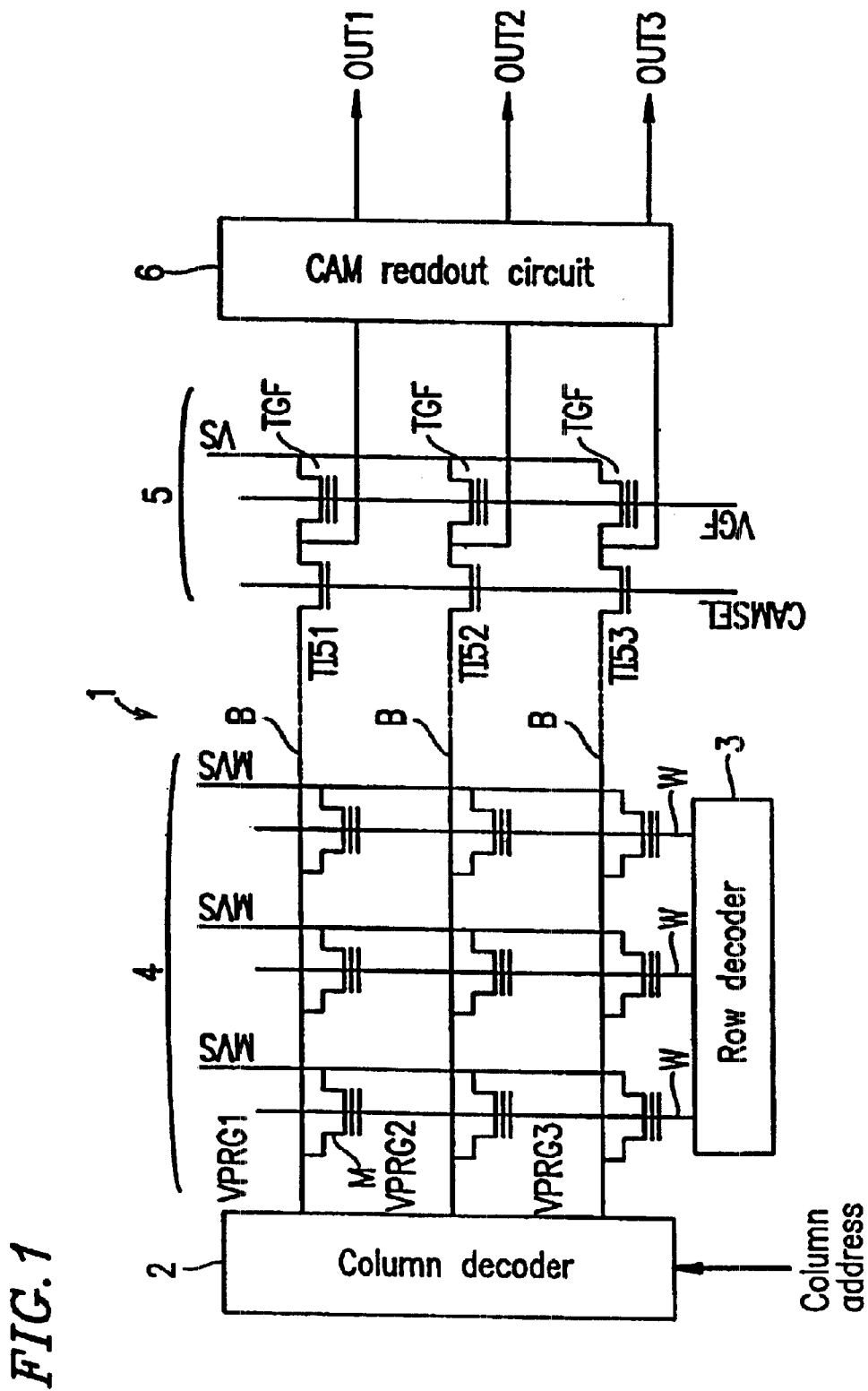
FIG. 1 is a circuit diagram showing an example of a primary structure of a nonvolatile semiconductor memory device according to Embodiment 1 of the present invention including a main memory circuit and a redundant memory circuit.

FIG. 1 is a circuit diagram showing primary structures of a main memory circuit and a redundant memory circuit in a nonvolatile semiconductor memory device 1 according to Embodiment 1 of the present invention. For simplification of description, FIG. 1 only illustrates several bit lines B and several word lines W for memory cells M. The number of each of the bit lines B, the word lines W and the memory cells M, which are actually present in the nonvolatile semiconductor memory device 1, varies according to a storage capacity of the nonvolatile semiconductor memory device 1. Also, as described below, there are cell circuits for the redundant memory circuit and redundant information readout circuit. The number of such cell circuits corresponds to the number of each of the bit lines B, the word lines W and the memory cells M.

In FIG. 1, the nonvolatile semiconductor memory device 1 includes a column decoder 2, a row decoder 3, a main memory circuit 4, a redundant memory circuit (CAM) 5 serving as a redundant substitution information memory circuit (e.g., a redundant address memory circuit), and a redundant information readout circuit (CAM readout circuit) 6.

The column decoder 2 sequentially selects a prescribed bit line B from a plurality of bit lines B based on an input address.

The row decoder 3 sequentially selects a prescribed word line W from a plurality of word lines W based on an input address.

The main memory circuit 4 includes the memory cells H arranged in a matrix form, which are formed of electrically writable and erasable floating gate transistors each provided at an intersection of the bit line B and word line W. The bit lines B carry signals VPRG1, VPRG2 and VPRG3 used for transferring data from the main memory circuit 4 during a data reading operation, and the column decoder 2 applies a prescribed high voltage to a drain of the floating gate transistor of the main memory circuit 4 during a data writing operation.

The redundant memory circuit 5 includes selection transistors TI51 through TI53 each connected in series to a corresponding bit line B in the main memory circuit 4 and a corresponding memory cell formed of the floating gate transistor TGF in which redundant substitution information (e.g., a defective address) can be electrically written and erased. One end of each memory cell for storing redundant substitution information can be electrically connected to and disconnected from a corresponding bit line B in the main memory circuit 4 by any one of the selection transistors TI51 through TI53. The memory cell for storing redundant substitution information is supplied with current for writing and reading operations via the bit lines B.

Accordingly, in the redundant memory circuit 5, the signals VPRG1 through VPRG3 carried by the bit lines B are used for applying a high voltage as a drain voltage to the floating gate transistor TGF so as to write redundant information therein or confirming a value of a threshold voltage of the floating gate transistor TGF in a test mode. That is, in the redundant memory circuit 5, the signals VPRG1 through VPRG3 are only used during a testing operation. The transistors TI51 through TI53 are controlled so as to be turned on by a write signal (a redundant memory circuit selection signal) CAMSEL only for writing data in the redundant memory circuit. Further, the signal VS is a source potential of the floating gate transistors TGF and is controlled so as to be a ground level voltage when data is read from or written in the floating gate transistor TGF and a high voltage of about 6 V when data is erased from the floating gate transistor TGF. A signal MVS is a source potential for the floating gate transistors in the main memory circuit 4 and is controlled in a similar manner to the signal VS for the redundant memory circuit 5. In this redundant memory circuit 5, there are N×(M+1) redundant memory circuit cells as shown in FIGS. 5 through 7.

Figure 5:
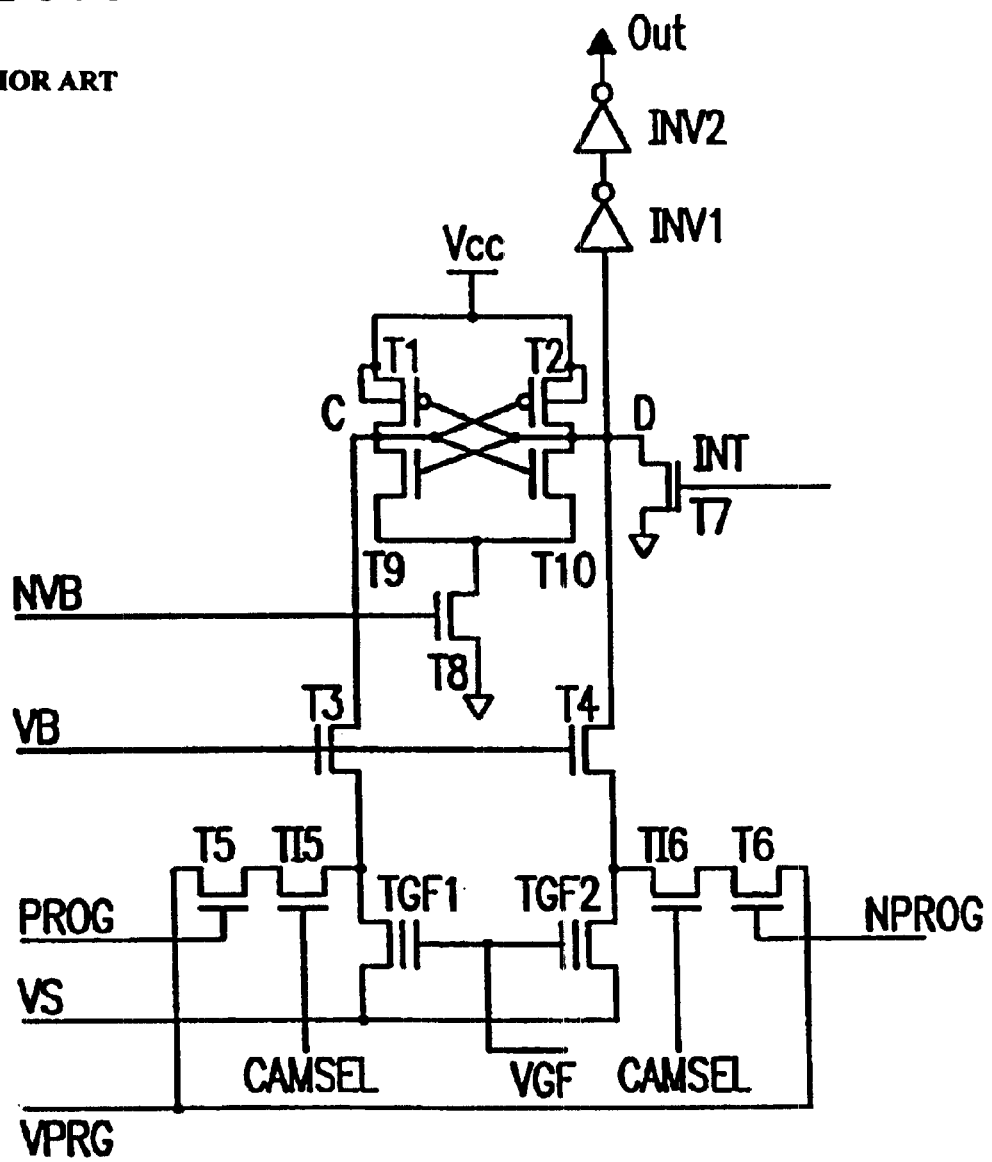
FIG. 5 is a circuit diagram showing a differential redundant memory circuit included in a single conventional cell circuit and a redundant information readout circuit associated with the differential redundant memory circuit.
Figure 6:
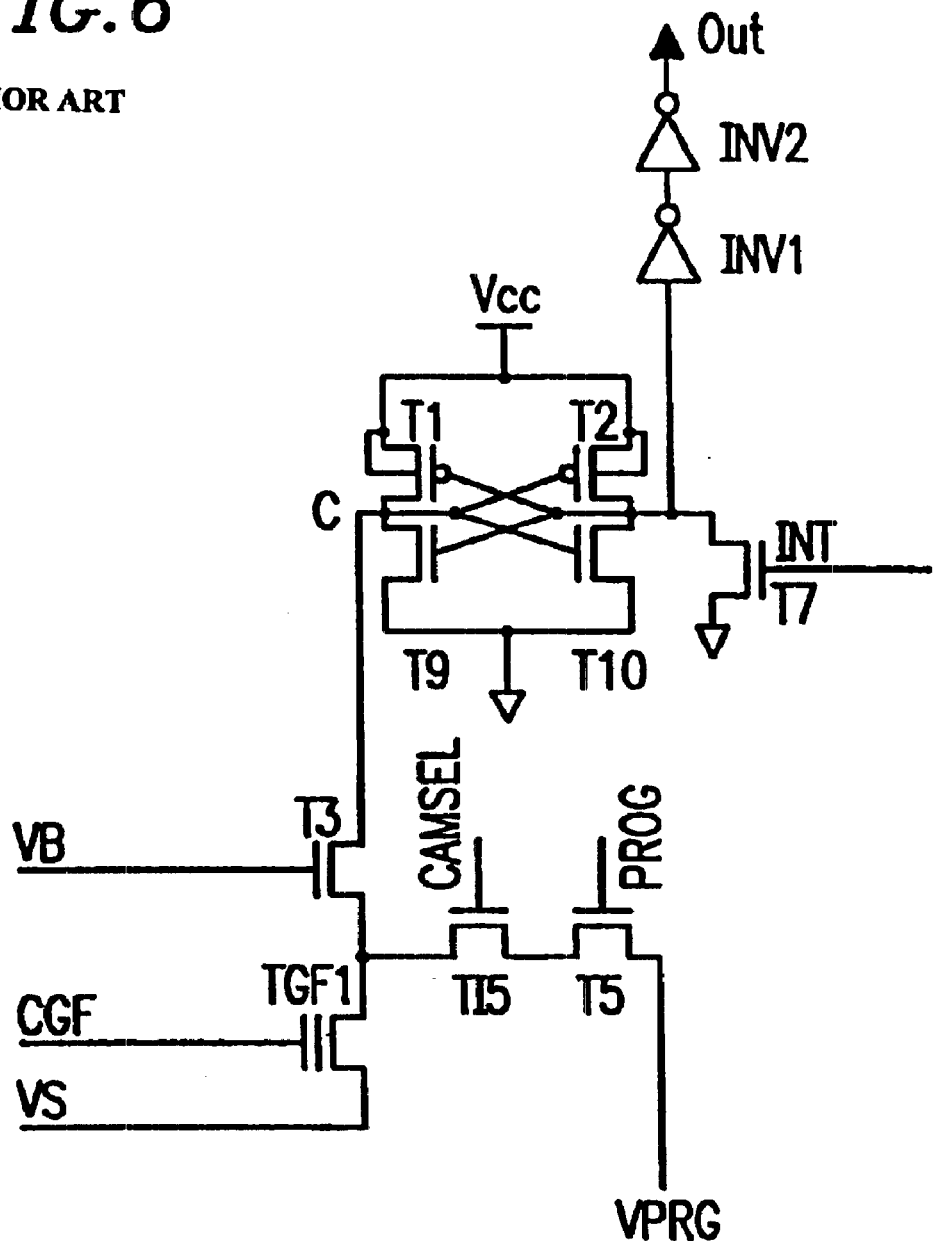
FIG. 6 is a circuit diagram showing a conventional single-end redundant memory circuit and a conventional redundant information readout circuit associated with the single-end redundant memory circuit, which are included in a single conventional cell circuit.
Figure 7:
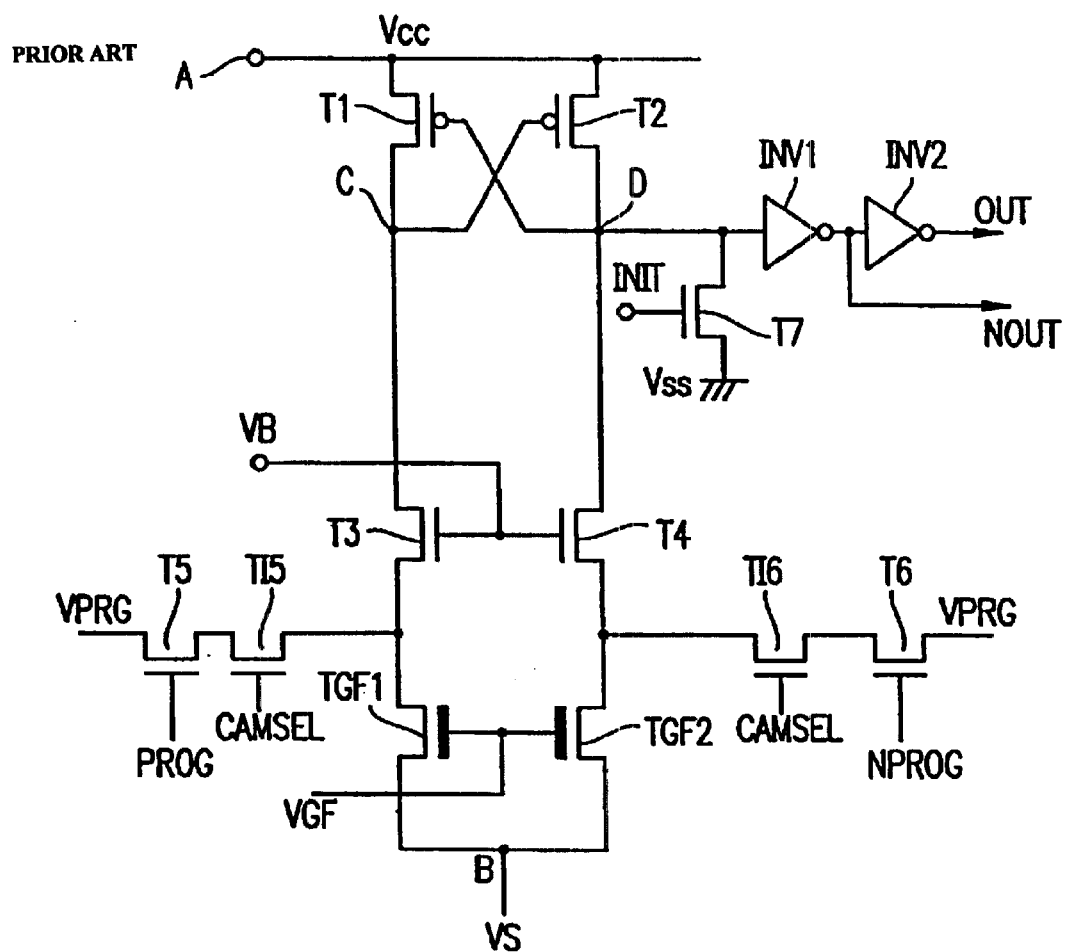
FIG. 7 is a circuit diagram showing a conventional redundant memory circuit and a conventional redundant information readout circuit associated with the redundant memory circuit, which are used together as a bistable multivibrator which does not hold data in a latch circuit.

The redundant information readout circuit 6 includes a differential latch-type circuit as shown in FIGS. 5 through 7, a single-end latch circuit, abistable multivibrator and the like. In this circuit, there are N×(M+1) redundant information readout memory circuit cells as shown in FIGS. 5 through 7.

Hereinafter, an operation of writing redundant information in the floating gate transistor TGF of the redundant memory circuit 5, which has the above-described configuration, is described.

In the redundant information readout circuit 6, the transistor T7 is turned on by the initialization signal INT as shown in FIGS. 5 through 7. This fixes an output of the redundant memory circuit 5 in a reset state, thereby eliminating adverse affects to internal circuits. Simultaneously, the transistors T3 and T4 are turned off by the readout signal VB so as to isolate the floating gate transistors TGF and the redundant information readout circuit 6 from each other.

Thereafter, the transistors TI51 through TI53 are commonly turned on by the write signal CAMSEL so as to electrically connect the drain of each floating gate transistor TGF in the redundant memory circuit 5 to a corresponding bit line B for the memory cell M in the main memory circuit 4, so that the gate voltage VGF applied to the floating gate transistor TGF of the redundant memory circuit 5 is raised to about 10 V which enables a writing operation.

The column decoder 2 selects the bit line B corresponding to an input bit line address (a column address) and applies a high voltage (about 6 V) to the selected bit line B. At this time, the low decoder 3 causes the potential of the word lines W in the main memory circuit 4 to be a ground level for preventing data to be erroneously written in the main memory circuit 4. This allows data to be written in the floating gate transistor TGF of the redundant memory circuit 5.

Figure 8:
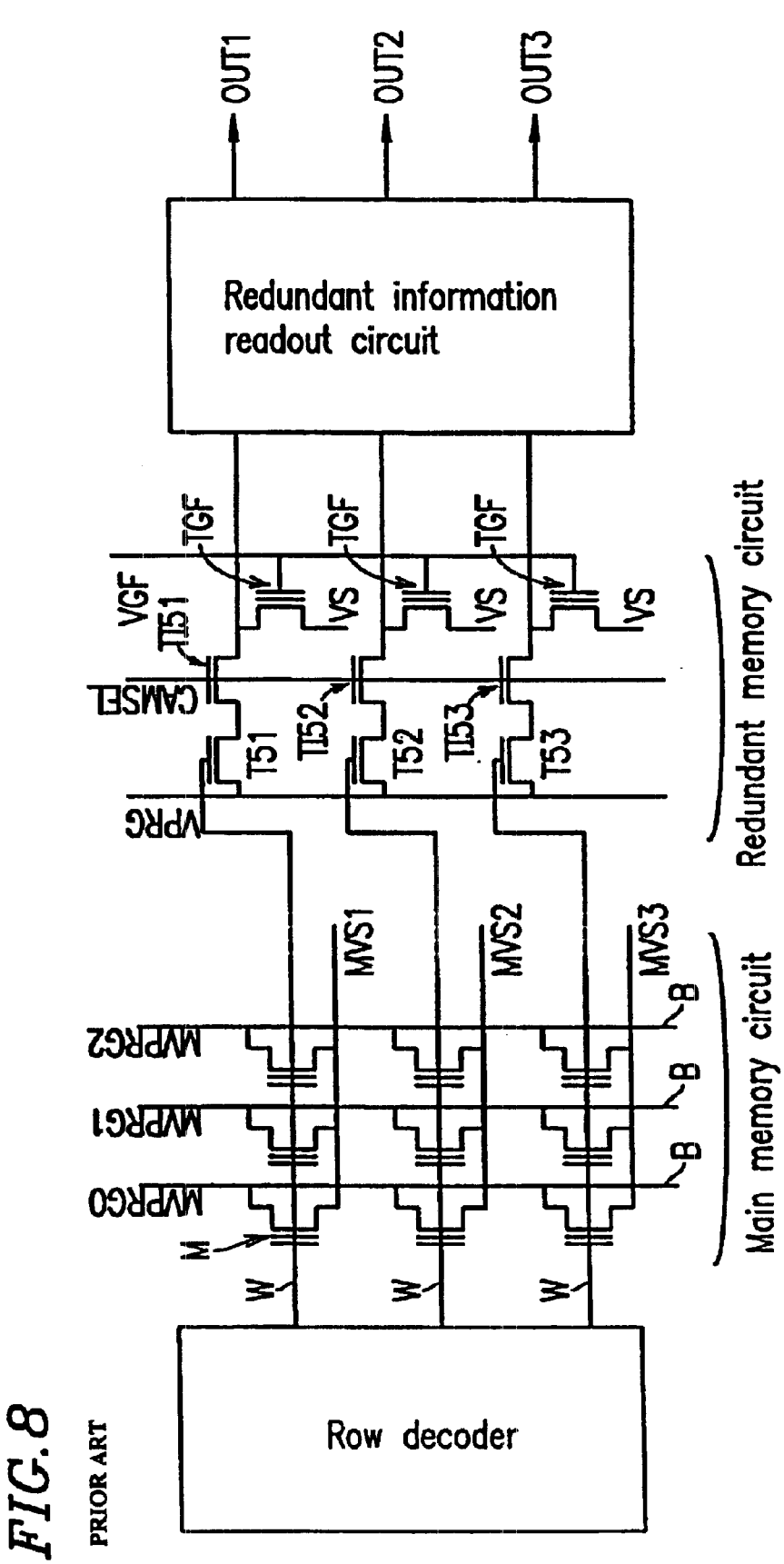
FIG. 8 is a circuit diagram showing memory cell array structures of a conventional main memory circuit and a conventional redundant memory circuit.
Figure 9:
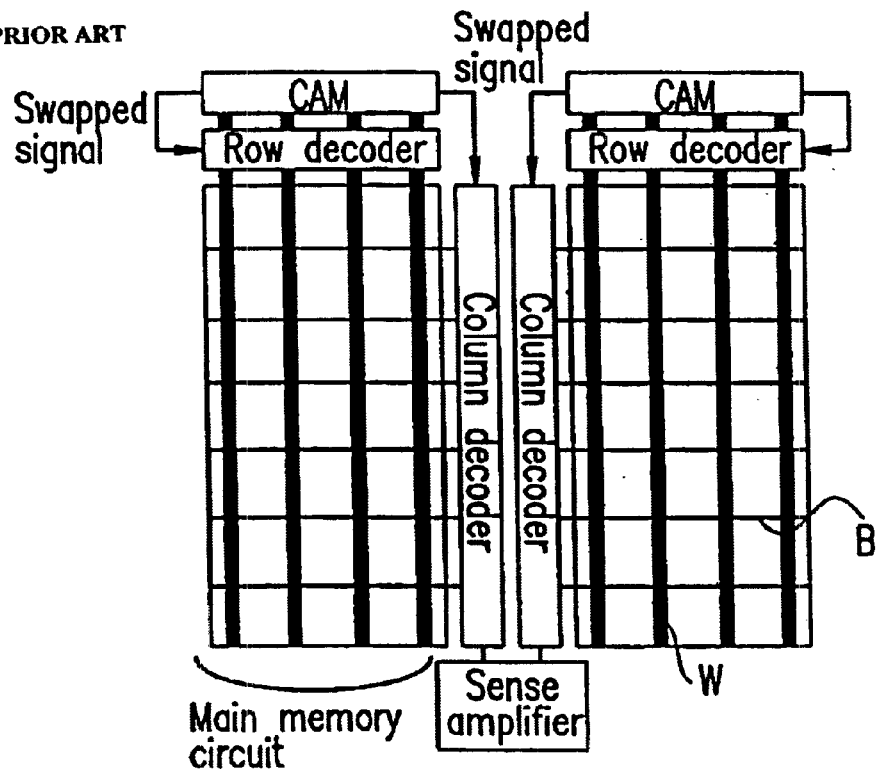
FIG. 9 shows an example of circuit layouts of a conventional nonvolatile semiconductor memory device including a conventional redundant memory circuit.
Figure 10:
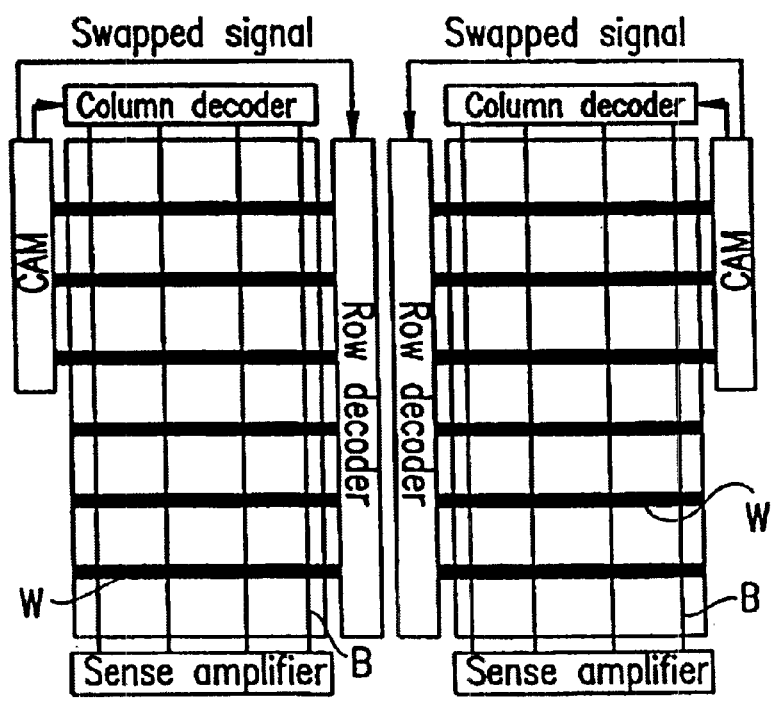
FIG. 10 shows another example of circuit layouts of the conventional nonvolatile semiconductor memory device including the conventional redundant memory circuit.
Figure 11:
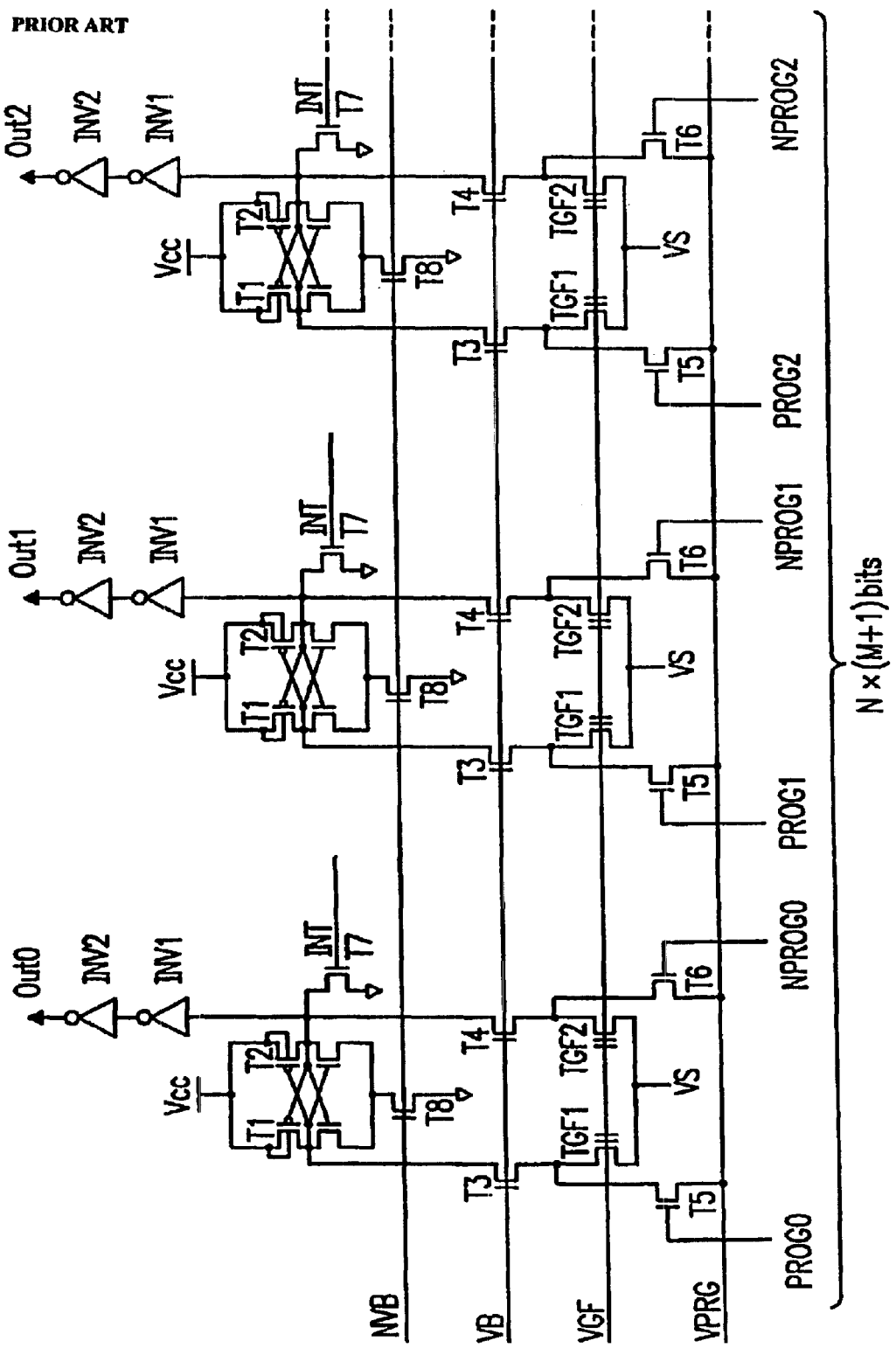
FIG. 11 is a circuit diagram showing an example of a primary structure of a conventional nonvolatile memory device including a conventional memory circuit and a conventional redundant information readout circuit.

As described above, according to Embodiment 1 of the present invention, by changing the arrangement of the floating transistors TGF in the redundant memory circuit 5 so as to be in a direction along which the bit lines B are provided, rather than a direction along which the word lines W are provided, it is possible to eliminate unnecessary spaces in the circuit layout as shown in FIG. 10. Further, the bit lines B can be commonly used by the floating gate transistors TGF in the redundant memory circuit 5 and the memory cells M in the main memory circuit 4, and therefore it is possible to eliminate the bit lines B which are conventionally required for exclusive use in the redundant memory circuit, so that a circuit layout area of the nonvolatile semiconductor memory device can be reduced. Along with this, the conventional transistors T51 through T53 of FIG. 8 can also be eliminated, further reducing the circuit layout area of the nonvolatile semiconductor memory device. Conventionally, when redundant information is written in the floating gate transistor TGF in the redundant memory circuit 5, the bit line B for the redundant memory circuit 5 is required to be selected so that the row decoder selects the redundant memory circuit, and the write signal CAMSEL is required to be a high voltage such that the redundant memory circuit 5 is in a writing mode. However, according to Embodiment 1 of the present invention, when redundant information (a defective address) is written in the floating gate transistor TGF in the redundant memory circuit 5, a decoder for selecting the bit line B in the main memory circuit is also used for selecting the floating gate transistor TGF having a drain to which a high voltage is applied. Therefore, it is not necessary to select the bit line B for the redundant memory circuit 5, so that the bit lines B for the redundant memory circuit and a circuit for selecting the bit line B for the redundant memory circuit can be eliminated, thereby reducing a circuit layout area, i.e., an area of the chip can be reduced.

Furthermore, by changing the arrangement of the floating transistors TGF in the redundant memory circuit 5 so as to be in a direction along which the bit lines B are provided, rather than a direction along which the word lines W are provided in the conventional nonvolatile semiconductor memory device, it is possible to reduce a load provided to the lines in the redundant memory circuit, thereby increasing a reading speed.

Further still, by employing a circuit arrangement in which the sense amplifier is positioned in a direction along which the bit lines B are provided, the nonvolatile semiconductor memory device can have a function of rapidly reading information from the memory cell in the main memory circuit 4.

Embodiment 2

Unlike Embodiment 1 of the present invention, where the floating gate transistors TGF in the redundant memory circuit 5 are arranged in a direction along which the bit lines B are provided, rather than in a direction along which the word lines W are provided in the conventional nonvolatile semiconductor memory device, in Embodiment 2, two pairs of redundant memory circuits and redundant information readout circuits are used for storing identical redundant memory information in addition to or without the circuit configuration according to Embodiment 1.

Figure 2:
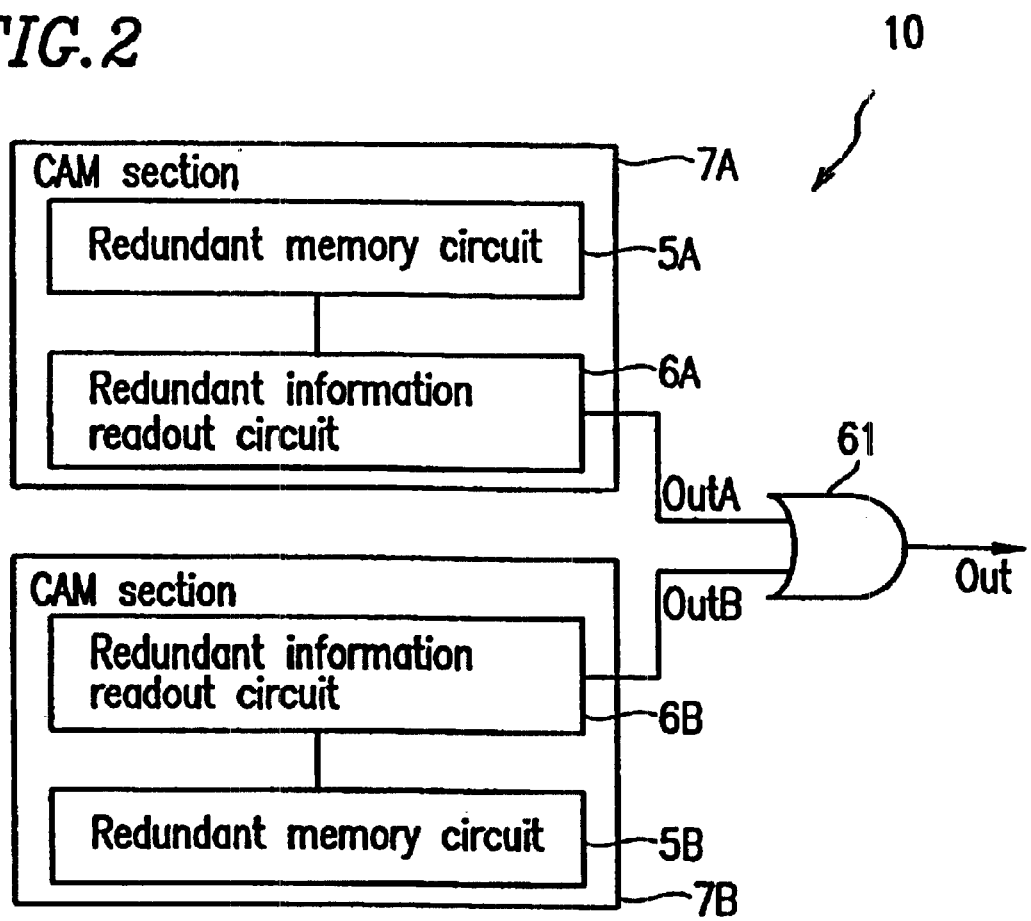
FIG. 2 is a circuit diagram showing an example of a primary structure of a nonvolatile semiconductor memory device according to Embodiment 2 of the present invention including a redundant memory circuit and a redundant information readout circuit.

FIG. 2 is a circuit diagram showing a primary structure of a nonvolatile semiconductor memory device 10 according to Embodiment 2.

In FIG. 2, the nonvolatile semiconductor memory device 10 includes a CAM section 7A, which has a redundant memory circuit 5A and an information readout circuit 6A (which are not shown), a CAM section 7B, which has a redundant memory circuit 5B and an information readout circuit 6B (which are not shown), and an OR gate 61 as a logic gate (a logic circuit). In this circuit configuration, outputs OutA and OutB respectively provided from the CAM sections 7A and 7B are input to the OR gate 61. The OR gate 61 performs a logical operation on the outputs OutA and OutB so as to reflect the outputs OutA and OutB from the normal redundant memory circuits (CAM sections 7A and 7B) in an output Out provided as one-bit binary information from the OR gate 61.

In this circuit configuration, states (writing or erasing) of floating gate transistors TGF used in the respective redundant memory circuits 5A and 5B of the CAM section 7A and 7B, which respectively provide the outputs OutA and OutB, are required to be the same.

An operation principal according to Embodiment 2 of the present invention is described with respect to a case where the logic gate is the OR gate 61 and the cell circuits of FIG. 5 are applied to the redundant memory circuits 5A and 5B and the redundant information readout circuits 6A and 6B.

As a first example, in the redundant memory circuit 5A, the floating gate transistor TGF1 is in a writing state and the floating gate transistor TGF2 is in an erasing state. Accordingly, in the redundant memory circuit 5B, the floating gate transistor TGF1 is in a writing state and the floating gate transistor TGF2 is in an erasing state. In this case, the outputs OutA and OutB respectively provided from the redundant information readout circuit 6A and 6B are at a low level. Therefore, the output Out from the OR gate 61 is at a low level.

As a second example, in both of the redundant memory circuits 5A and 5B, each floating gate transistor TGF1 is in an erasing state and each floating gate transistor TGF2 is in a writing state. In this case, the outputs OutA and OutB respectively provided from the redundant information readout circuit 6A and 6B are at a high level. Therefore, the output Out from the OR gate 61 is at a high level.

Each of the first and second examples have been described with respect to a case where the floating gate transistors TGF1 and TGF2 of the redundant memory circuit 5A and 5B have no defects. Next, a case where any one of the floating gate transistors TGF1 and TGF2 in either one of the redundant memory circuits 5A and 5B has a defect is described.

In the redundant memory circuit 5A corresponding to the output OutA, the floating gate transistor TGF1 is in an erasing state and the floating gate transistor TGF2 is in a writing state. In the redundant memory circuit 5B corresponding to the output OutB, the floating gate transistors TGF1 and TGF2 are defective and each of the defective floating gate transistors TGF1 and TGF2 is in a state where no data can be written, i.e., each of the transistors TGF1 and TGF2 is in an erasing state.

In this case, by employing a circuit design in which the current drive power of each of the floating gate transistors TGF1 and TGF2 in the redundant memory circuits 5A and 5B in the erasing state is greater than that of each of the PMOS transistors T1 and T2 of the latch circuit (FIG. 5), each drain voltage (i.e., voltage applied to points C and D) of the PMOS transistors T1 and T2 is at low level and the output OutB is also at a low level. The resultant output Out from the OR gate 61 is a high level since the output Out is a logical sum OR of high-level and low-level outputs, and therefore the output from the normal circuit (the redundant memory circuit 5A) is reflected in the output Out. In this case, a shoot-through current flows through two arms in a defective redundant information readout circuit as shown in FIG. 5, and thus it is preferable to use the latch redundant information circuit as shown in FIGS. 5 and 6.

As described above, according to Embodiment 2 of the present invention, two pairs of redundant memory circuits and redundant information readout circuits are used for storing identical redundant memory information and both of the two pairs redundant memory circuits and redundant information readout circuits store one-bit binary information. Accordingly, even in the case where one of the floating gate transistors TGF in either of the redundant memory circuits 5A and 5B is defective, e.g., one of the transistors TGF in the circuit 5A is defective, so long as the floating gate transistors in the redundant memory circuit 5B are normal, an output from the normal circuit (redundant memory circuit 5B) is reflected in the resultant output Out from the OR gate 61 so as to provide an output having a normal value, thereby improving circuit redundancy.

Although Embodiment 2 has been described with respect to the case where the two pairs of redundant memory circuits and redundant information readout circuits are used for storing identical redundant memory information, the redundant memory circuits and redundant information readout circuits of three pairs or more can be used for storing the identical redundant memory information so as to improve circuit redundancy.

Further, although the OR gate 61 is used as the logic gate, another type of gate can be used as the logic gate in order to perform a logical operation on the output from the normal redundant memory circuit so as to be reflected in the resultant logic output. Alternatively, a composite gate can be used in conjunction with another signal so as to obtain the resultant logic output according to a circuit structure.

Furthermore, although each of the two redundant information readout circuits 6A and 6B is structured like a latch circuit as shown in FIG. 5, the present invention is not limited to such a structure, and any two types of circuits including the latch circuits of FIGS. 5 and 6 and the bistable multivibrator circuit of FIG. 7 can be used to obtain the resultant logic output Out based on logic levels of the respective outputs from the two types of circuits.

Embodiment 3

In Embodiment 3, the number of memory cells in the redundant memory circuit 5 is smaller than the number of the bit lines B in the main memory circuit 4 and unused floating gate transistors and their associated dummy bit lines are positioned at a regular interval.

Figure 3:
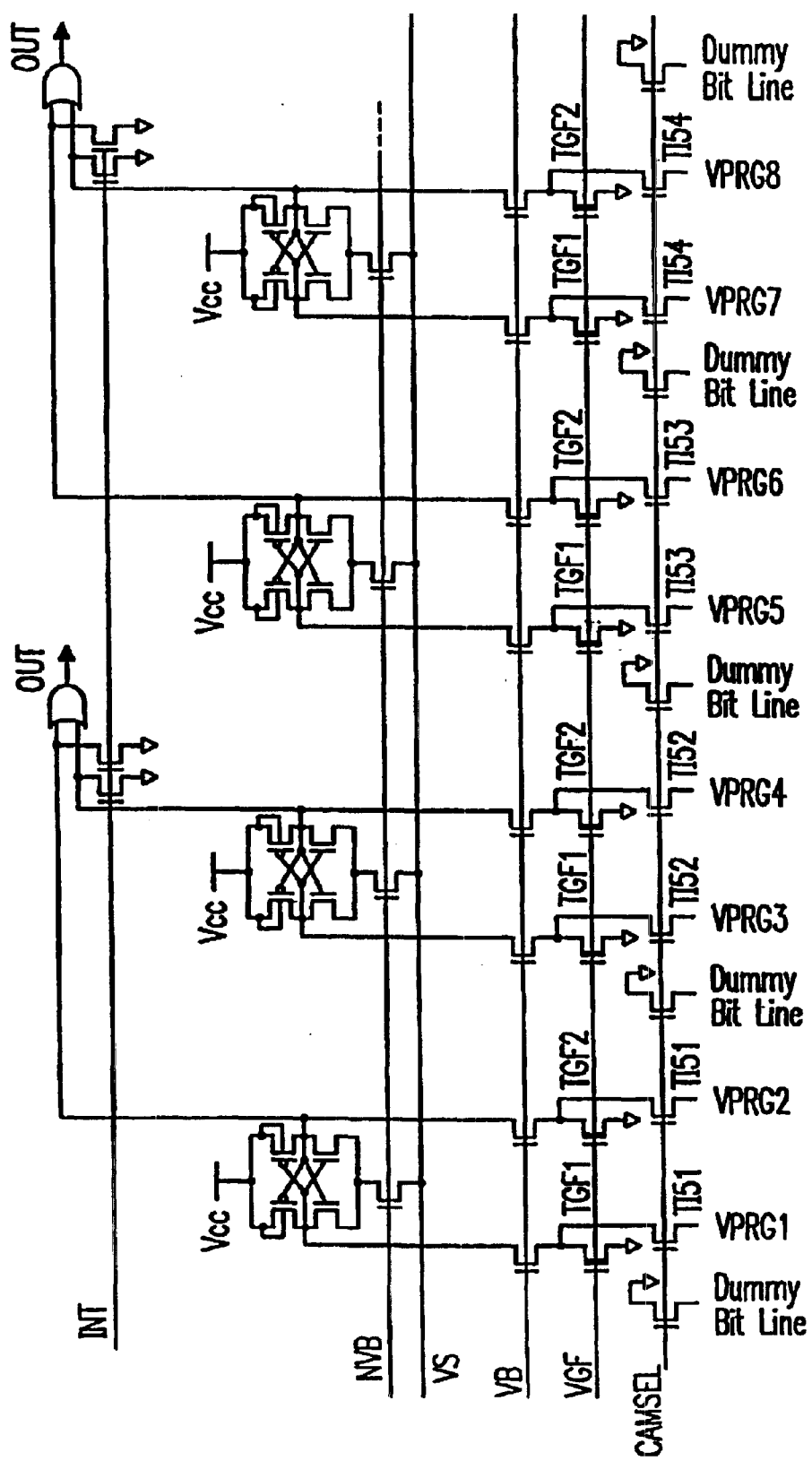
FIG. 3 is a circuit diagram showing an example of a primary structure of a nonvolatile semiconductor memory device according to Embodiment 3 of the present invention including a redundant memory circuit and a redundant information readout circuit.

FIG. 3 is a circuit diagram showing primary configurations of the redundant memory circuit and redundant information readout circuit in a nonvolatile semiconductor memory device according to Embodiment 3 of the present invention.

In FIG. 3, VPRG1 through VPRG8 denote bit line signals each supplying a high voltage to a drain of the floating gate transistors TGF1 or TGF2 of the redundant memory circuit 5 when redundant information is written in the floating gate transistors TGF1 or TGF2 of the redundant memory circuit 5. Two adjacent lines (e.g., VPRG1 and VPRG 2, VPRG7 and VPRG 8) for writing redundant information are commonly connected to a corresponding bit line B of the main memory circuit 4. In FIG. 3, pairs of the bit line signals VPRG1 and VPRG2, VPRG3 and VPRG4, VPRG5 and VPRG6, and VPRG7 and VPRG8 are shown. The respective floating gate transistors TGF1 and TGF2 of the redundant memory circuits are isolated from a corresponding bit line by respective selection transistors TI51 through TI54 each having a gate which receives a signal CAMSEL indicating that redundant information is being written.

Although dummy bit lines are used as ordinary bit lines in the main memory circuit 4, the dummy bit lines are not connected to the drains of the floating gate transistors TGF1 and TGF2 in the redundant memory circuit 5 but each of the dummy bit lines is connected to ground via a transistor having a gate which receives the signal CAMSEL. In this manner, by providing spaces for the dummy bit lines between cell circuits of the redundant memory circuits 5 and redundant information readout circuits 6, it is possible to prevent circuit failure from being caused due to a short-circuit between the adjacent cell circuits of the redundant memory circuit 5 and redundant information readout circuit 6.

As described above, in Embodiment 3 of the present invention, the number of memory cells in the redundant memory circuit 5 is smaller than the number of the bit lines B in the main memory circuit 4. Some of the flash cells in the redundant memory circuit 5 are not used as the memory cells and the bit lines (dummy bit lines) associated with the unused memory cells are not used either. The unused dummy bit lines are positioned at a regular interval so as to be connected to ground, rather than the drains of the floating gate transistors TGF1 and TGF2 in the redundant memory circuit 5. In this manner, by providing spaces for the dummy lines between the cells in the redundant memory circuit 5, a short-circuit does not occur between the adjacent cells in the redundant memory circuit 5, thereby improving fault tolerance. The dummy bit lines increase the possibility that the defective bit line B is relieved.

Although FIG. 3 illustrates the differential latch-type circuit of FIG. 5 as the redundant memory readout circuit, the single-end latch circuit of FIG. 6 or the bistable vibrator-type circuit of FIG. 7 can be used as the redundant memory readout circuit. Further, the memory cells in the redundant memory circuit, which are not normally used, can be positioned at a regular interval in addition to or without the unused dummy bit lines, which are also positioned at a regular interval. The unused memory cells increase the possibility that the defective memory cell is relieved.

Embodiment 4

In Embodiment 4 of the present invention, the redundant memory circuit 5 is provided with a parallel circuit formed by the floating gate transistors TGF1 and TGF3.

Figure 4:
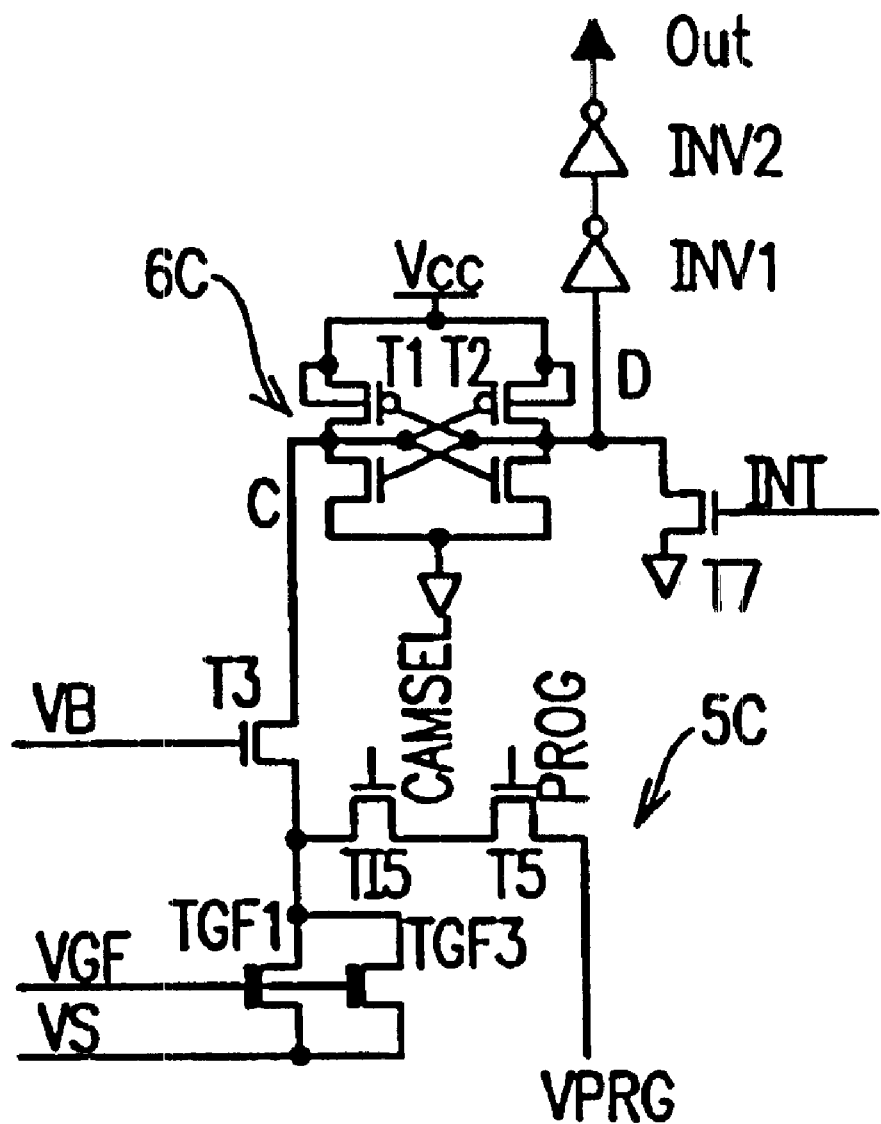
FIG. 4 is a circuit diagram showing an example of a primary structure of a nonvolatile semiconductor memory circuit according to Embodiment 4 of the present invention including a redundant memory circuit and a redundant information readout circuit which can be operated at a low voltage.

FIG. 4 is a circuit diagram showing primary structures of the redundant memory circuit and the redundant information readout circuit operable at a low voltage in a nonvolatile semiconductor memory circuit according to Embodiment 4.

In FIG. 4, a redundant memory circuit 5C includes the parallel circuit connected to a VS line, which is formed by the floating gate transistor TGF1 and an equivalent floating gate transistor TGF3 to the floating gate transistor TGF1. These two floating gate transistors TGF1 and TGF3 are always required to be in the same state (a writing or erasing state) as that of another.

An operation principle of a redundant information readout circuit 6C is described with respect to the case where redundant information is read from the redundant memory circuit 5C.

The CAMSEL and PROG signals are not provided to transistors TI5 and T5 during a reading operation, and thus the transistors TI5 and T5 are in an "OFF" state and a program voltage signal VPRG is not applied to the floating gate transistors TGF1 and TGF3.

In this case, the redundant information readout signal VB is not provided to the transistor T3, and therefore the transistor T3 is in an "OFF" state. A gate voltage VGF applied to the floating gate transistors TGF1 and TGF3 is equal to a power supply voltage Vcc, and a source voltage VS is at a ground level. Prior to the reading operation, an initialization signal INT is input to a transistor T7 so that the transistor T7 is turned on, a drain voltage (point D) of the transistor T7 is caused to be at a ground level, and an output Out from the redundant information readout circuit 6C is caused to be at a low level.

Simultaneously, a voltage level at a side of the latch circuit opposite to the side to which the transistor T7 is connected, i.e., a drain of the transistor T3 (point C), is caused to be at a high level due to the property of the latch circuit.

Thereafter, the initialization signal INT is caused to be at a low level so that the transistor T7 is turned off. Further, the readout signal VB is caused to be at a high level so as to start reading redundant information from the floating gate transistors TGF1 and TGF3.

In the case where the floating gate transistors TGF1 and TGF3 are in an erasing state, by driving the two floating gate transistors TGF1 and TGF3, it is possible to invert the potential of the transistor T3 so as to be at a low level, even if the power supply source voltage Vcc is low. This causes potential in the latch circuit to be inverted, so that output Out from the redundant information readout circuit 6C is caused to be at high level.

In the case where the floating gate transistors TGF1 and TGF3 are in a writing state, potential in the latch circuit is not inverted and the output Out from the redundant information readout circuit 6C remains at low level.

As described above, according to Embodiment 4, one selection transistor is connected to the drains of the two floating gate transistors TGF1 and TGF3 forming a parallel circuit, and therefore, in one of the two arms formed between the redundant memory circuit and the redundant information readout circuit, a drain voltage of the PMOS transistor T1 is determined by the current power of the PMOS transistor T1 and the two floating gate transistors TGF1 and TGF3. In the case where the current driving power of the floating gate transistors TGF1 and TGF3 is lower than that of the PMOS transistor T1, it is particularly effective that the drain voltage of the PMOS transistor T1 is low. Accordingly, the parallel circuit formed by the two floating gate transistors TGF1 and TGF3 realizes the redundant memory circuit which can perform reliable a reading operation even at a low voltage.

Although the latch circuit shown in FIG. 4 is identical to the single-end latch circuit of FIG. 6, similar effects can be achieved by the cell circuits of FIGS. 5 and 7.

In Embodiments 1 through 4, although redundant substitution information such as defective address information is stored in the redundant memory circuit, a redundant memory circuit for storing information used for adjusting the memory circuit can be provided in addition to the redundant memory circuit storing redundant substitution information. Adjustments in the memory circuit described herein include adjustments in a pulse width of a clock signal generated in the memory device or determination as to whether or not use of an optional circuit is required.

As described above, according to the present invention, it is possible to prevent an increase in load provided to the lines in the redundant memory circuit as shown in FIG. 10 so as to provide a fast reading speed and it is also possible to eliminate unnecessary spaces in the circuit layout as shown in FIG. 10. Further, as compared to the conventional nonvolatile memory device in which the redundant memory circuit is positioned in a direction along which the word lines are provided, it is possible to eliminate the bit lines exclusively used for the redundant memory circuit as well as the redundant memory circuit selection transistors and their associated lines, thereby reducing a circuit layout area, i.e., an area of the chip can be reduced.

Further, the respective memory cells of the redundant substitution information memory circuits of two pairs (or more) store identical one-bit binary information, and therefore even in the case where there is a defect in one pair of floating gate transistors among the floating gate transistors in the redundant substitution information memory circuits of two pairs, when the other pair of the floating gate transistors are normal, the output having a normal value can be provided from the redundant substitution information memory circuit, thereby further improving circuit redundancy.

Figure 12:
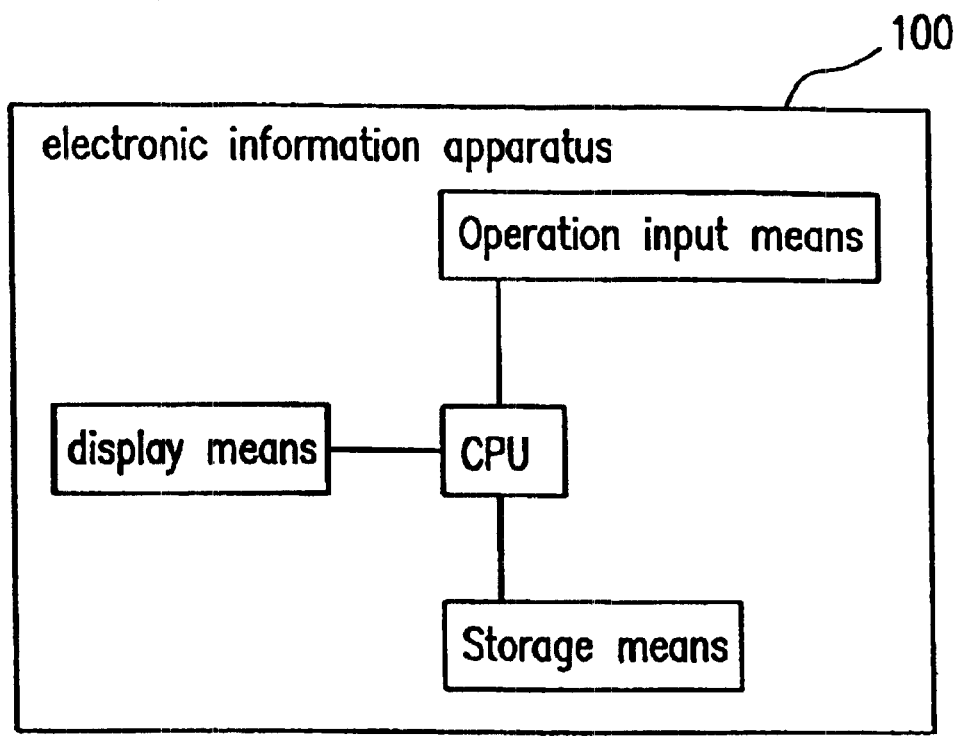
FIG. 12 is a block diagram showing a basic structure of an electronic information apparatus to which the nonvolatile semiconductor memory device of the present invention is applied.

Furthermore, by providing at least either of the unused redundant substitution information memory cells or the bit lines at a regular interval in the sequentially-provided redundant memory circuits and redundant information readout circuits, a short-circuit is prevented from occurring between the adjacent cell circuits, thereby improving fault tolerance. This increases the possibility that the defective bit line B is relieved. The nonvolatile semiconductor memory device as described in Embodiments 1 through 4 can be easily incorporated into an electronic information device, such as a mobile phone or a computer, thereby achieving the effects of the present invention. For example, as shown in FIG. 12, in the case where there is provided an electronic information apparatus 100 which includes: an information storage means or section such as a flash memory; an operation input means or section; a display means or section, such as a liquid display device, which displays a startup screen, results of information processing, etc.; and a CPU (Central Processing Unit) which receives a control command from the operation input means and processes information (e.g., video data, audio data, etc.) based on a prescribed program and data associated with the program whilst performing information reading and writing processes (memory operations) on the information storage means, the nonvolatile semiconductor memory device of the present invention can be easily incorporated into the electronic information apparatus 100 as the information storage means.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A nonvolatile semiconductor memory device comprising:

a main memory circuit including memory cells arranged in a matrix form, the memory cells being formed of electrically writable and erasable floating gate transistors each provided at an intersection of a bit line and a word line; and a redundant substitution information memory circuit including a plurality of memory cells formed of the electrically writable and erasable floating gate transistors, wherein one end of each memory cell formed of the floating gate transistors in the redundant substitution information memory circuit can be electrically connected to and disconnected from the bit line in the main memory circuit by a selection transistor so as to supply the memory cells in the redundant substitution information memory circuit with current for writing and reading operations via the bit lines.

2. A nonvolatile semiconductor memory device according to claim 1, wherein at least two pairs of the redundant memory circuits and redundant information readout circuits are used for storing identical redundant memory information, and a logic circuit for performing a logical operation on outputs from the two redundant information readout circuits is connected to an output of each of the two redundant information readout circuits so as to reflect a normal output from either of the two redundant memory circuits in an output provided as one-bit binary information from the logic circuit.

3. A nonvolatile semiconductor memory device according to claim 2, wherein a single selection transistor is connected to drains of the plurality of memory cells included in the redundant substitution information memory circuit so as to form a parallel circuit.

4. A nonvolatile semiconductor memory device according to claim 2, wherein the redundant substitution information memory circuit is capable of storing information used for adjusting the memory device in addition to redundant substitution information.

5. A nonvolatile semiconductor memory device according to claim 1, wherein the number of the memory cells used in the redundant substitution information memory circuit is smaller than the number of the bit lines in the main memory circuit, and at least either of unused redundant substitution information memory cells or dummy bit lines are provided at a regular interval.

6. A nonvolatile semiconductor memory device according to claim 5, wherein a single selection transistor is connected to drains of the plurality of memory cells included in the redundant substitution information memory circuit so as to form a parallel circuit.

7. A nonvolatile semiconductor memory device according to claim 5, wherein the redundant substitution information memory circuit is capable of storing information used for adjusting the memory device in addition to redundant substitution information.

8. A nonvolatile semiconductor memory device according to claim 1, wherein a single selection transistor is connected to drains of the plurality of memory cells included in the redundant substitution information memory circuit so as to form a parallel circuit.

9. A nonvolatile semiconductor memory device according to claim 8, where in the redundant substitution information memory circuit is capable of storing information used for adjusting the memory device in addition to redundant substitution information.

10. A nonvolatile semiconductor memory device according to claim 1, wherein the redundant substitution information memory circuit is capable of storing information used for adjusting the memory device in addition to redundant substitution information.

11. An electronic information apparatus comprising the nonvolatile semiconductor memory device of claim 1 for processing information.

* * * * *